US006930488B1

(12) United States Patent
Gross et al.

(10) Patent No.: US 6,930,488 B1
(45) Date of Patent: Aug. 16, 2005

(54) METHOD AND APPARATUS FOR ACCELERATED SER TESTING OF CIRCUITRY

(75) Inventors: Kenneth C. Gross, San Diego, CA (US); David K. McElfresh, San Diego, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 7 days.

(21) Appl. No.: 10/739,826

(22) Filed: Dec. 17, 2003

(51) Int. Cl.$^7$ .................. G01R 31/26; G01R 31/00; G01T 1/24
(52) U.S. Cl. ................ 324/501; 324/765; 250/370.01
(58) Field of Search ............................ 324/501, 765, 324/713; 250/370.06, 370.07, 374, 379, 384, 250/378, 370.01, 380, 381

(56) References Cited

U.S. PATENT DOCUMENTS

| | | | |
|---|---|---|---|
| 4,816,753 A | 3/1989 | Palkuti | 324/158 |
| 4,839,586 A * | 6/1989 | Musseau et al. | 324/501 |
| 5,523,597 A * | 6/1996 | Baumann et al. | 257/297 |
| 5,743,944 A | 4/1998 | Gross et al. | 96/181 |
| 5,952,655 A | 9/1999 | Gross et al. | 250/304 |
| 6,348,356 B1 * | 2/2002 | Shabde et al. | 438/14 |
| 6,456,084 B1 | 9/2002 | Wu et al. | 324/501 |
| 2004/0212388 A1 * | 10/2004 | Baumann | 324/765 |

OTHER PUBLICATIONS

Baumann, Robert. "The Impact of Technology Scaling on Soft Error Rate Performance and Limits to the Efficacy of Error Correction", IEEE International Electron Devices Meeting (IEDM), Dec. 2002.*
Publication entitled "Solubility Investigations in Support of Ultrasensitive Noble Gas Detector Development", by Kenny C. Gross et al., American Nuclear Society winter meeting, Nov. 15-19, 1998, Washington DC, U.S. Dept. of Energy, Nuclear Energy Programs under Contract W-31-109-Eng-38.
Publication entitled "Low-Energy Degassing Mechanisms for a Fluid-Based Radioxenon Detection System", by W.R. Russ et al., 20$^{th}$ Annual Research Symposium on Monitoring a Comprehensive Nuclear Test Ban Treaty, Sep. 21-23, 1998, Sante Fe, NM, .S. Dept. of Energy, Nuclear Energy Programs under Contact W-31-109-Eng-38.
Publication entitled "Fluid transfer concentration of airborne radioxenon to enhance monitoring capabilities", by W.R. Russ et al., Nuclear Instruments and Methods in Physics Research A 422 (1999), pp. 820-825.
Publication entitled "Improved Radioxenon Detection Techniques for use with Fluid-Based Concentration", By. W.R. Russ et al., 1999 IEEE Nuclear Science Symposium, Oct. 26-28, 1999, Seattle, WA.
Publication entitled "Fluid-Based Radon Mitigation Technology Development for Industrial Applications", by K.V. Liu et al., ANL/RE/CP—90091, CONF-9606206-13 2.
Publication entitled "Fluid-Based System for Radon Mitigation", by Kenny C. Gross et al., 1999 International Radon Symposium sponsored by the Americal Ass. Of Radon Scientists and Technologists in Las Vegas, NV, Nov. 9-12, 1999, U.S. Dept. of Energy, Nuclear Energy Programs under Contract W-31-109-Eng-38.

* cited by examiner

Primary Examiner—Anjan Deb
Assistant Examiner—Jeff Natalini
(74) Attorney, Agent, or Firm—Park, Vaughan & Fleming LLP

(57) ABSTRACT

One embodiment of the present invention provides a system that facilitates accelerated Soft-Error Rate (SER) testing of circuitry. The system starts by collecting a radioactive gas from the atmosphere and concentrating the radioactive gas in a testing chamber. Once the desired amount of radioactive gas is present in the testing chamber, the system SER tests the circuitry in the testing chamber by bombarding the circuitry with particles emitted from the radioactive gas while running testing procedures.

13 Claims, 2 Drawing Sheets

METHOD AND APPARATUS FOR ACCELERATED SER TESTING OF CIRCUITRY

BACKGROUND

1. Field of the Invention

The present invention relates to testing of computer systems. More specifically, the present invention relates to a method and an apparatus for accelerated Soft Error Rate (SER) testing of circuitry, including integrated circuits and memory chips.

2. Related Art

As technology advances give rise to ever higher density memory chips and increasing system clock frequencies it is imperative to have the capability to follow design rules to ensure immunity to transient errors caused by bit flipping due to radioactive decay from parts-per-million level contaminants in chip packaging materials. Without the ability to generate, stimulate and observe these phenomena it is difficult or impossible to create rules for chip designers to use to adequately design systems that are immune to Soft Error Rate (SER) or signal integrity interrupts.

Currently, it is costly and dangerous to accelerate SER by exposing unpackaged or prepackaged chips to radioactive isotopes. Accelerating alpha and/or beta particles to induce SER events has heretofore required access to facilities that have isotopic sources that are licensed by the US. Nuclear. Regulatory. Commission plus state and local licensing organizations. This creates a substantial barrier for chip designing organizations to acquire their own radiation sources/facilities. Because of the combination of cost, complexity, and personnel safety issues, companies typically pay substantial fees for irradiation experiments in licensed government or private radiation facilities.

Hence, what is needed is a method for accelerated SER testing of circuitry that is low-cost and environmentally safe as compared to current testing methods.

SUMMARY

One embodiment of the present invention provides a system that facilitates accelerated. Soft-Error. Rate (SER) testing of circuitry. The system starts by collecting a radioactive gas from the atmosphere and concentrating the radioactive gas in a testing chamber. Once the desired amount of radioactive gas is present in the testing chamber, the system SER tests the circuitry in the testing chamber by bombarding the circuitry with particles emitted from the radioactive gas while running testing procedures.

In a variation on this embodiment, the radioactive gas is. Radon.

In a variation on this embodiment, the circuitry comprises an integrated circuit.

In a further variation, the integrated circuit comprises a memory chip.

In a variation on this embodiment, collecting the radioactive gas involves passing air from the atmosphere through oil so that the radioactive gas becomes trapped in the oil.

In a further variation, the oil is corn oil.

In a variation on this embodiment, concentrating the radioactive gas further involves releasing the radioactive gas from the oil, and moving the radioactive gas into the testing chamber until a specified amount of the radioactive gas has been concentrated.

In a further variation, releasing the radioactive gas from the oil further involves heating the oil, wherein heating the oil allows the radioactive gas to escape from the oil.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Radon Gas Collection and Concentration System

Figure 1:
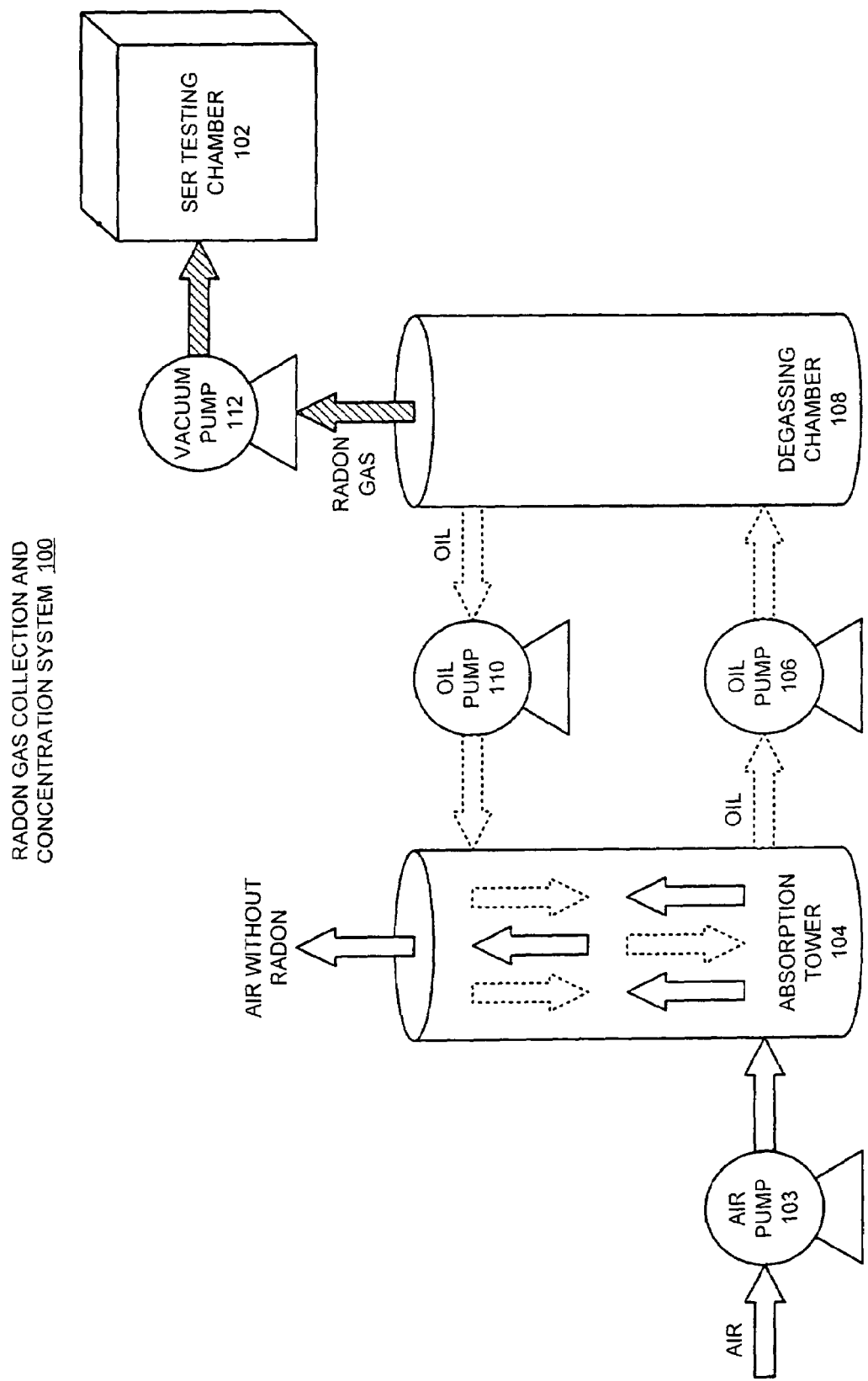
FIG. 1 illustrates a radon gas collection and concentration system in accordance with an embodiment of the present invention.

FIG. 1 illustrates a radon gas collection and concentration system 100 in accordance with an embodiment of the present invention. Radon gas collection and concentration system 100 presents a simple, low cost and biologically benign means of constructing a Soft Error Rate (SER) testing chamber 102 that requires no federal nuclear-facility licensing, yet allows true (not simulated) acceleration of SER events for unpackaged or prepackaged memory chips. The invention does require personnel to be cautious, as radiation levels will accumulate inside SER testing chamber 102 that are higher than would be recommended for human ingestion. However, the safety margins for using this invention are far greater than those of standard machine shop equipment or a kitchen microwave.

Radon gas (Rn-222) is the major contributor to the natural radiation exposure of the average individual in the United States. Although all outdoor air contains radon at very low levels, the concentration is enhanced in homes and buildings. The soil beneath the building is the primary radon source, and restrictions to free mixing of indoor and outdoor air cause elevated concentrations within building interiors. The primary mechanism for driving the radon rich soil gas into the building is a pressure gradient with the outdoors; outdoor/indoor temperature differences or wind effects cause a slight depressurization of the building interior, whereupon Radon, a noble gas, diffuses easily through pores and micro-cracks in concrete.

Note that the immutable laws of quantum physics limit the total quantity of radioactive Rn gas inside SER testing chamber 102. This is because the half life of Rn-222 is 4 days. There is therefore no conceivable way the level of radioactivity in SER testing chamber 102 could "increase to infinity," even if the system is left perpetually running, either inadvertently or maliciously. The radioactivity level inside SER testing chamber 102 builds up to a secular equilibrium. One controls the specific radioactivity (disintegrations/sec/cc) inside SER testing chamber 102 simply by varying the volume of SER testing chamber 102 (for a given flow rate of corn oil in absorption tower 104).

Accelerated SER Testing of Circuitry

Figure 2:
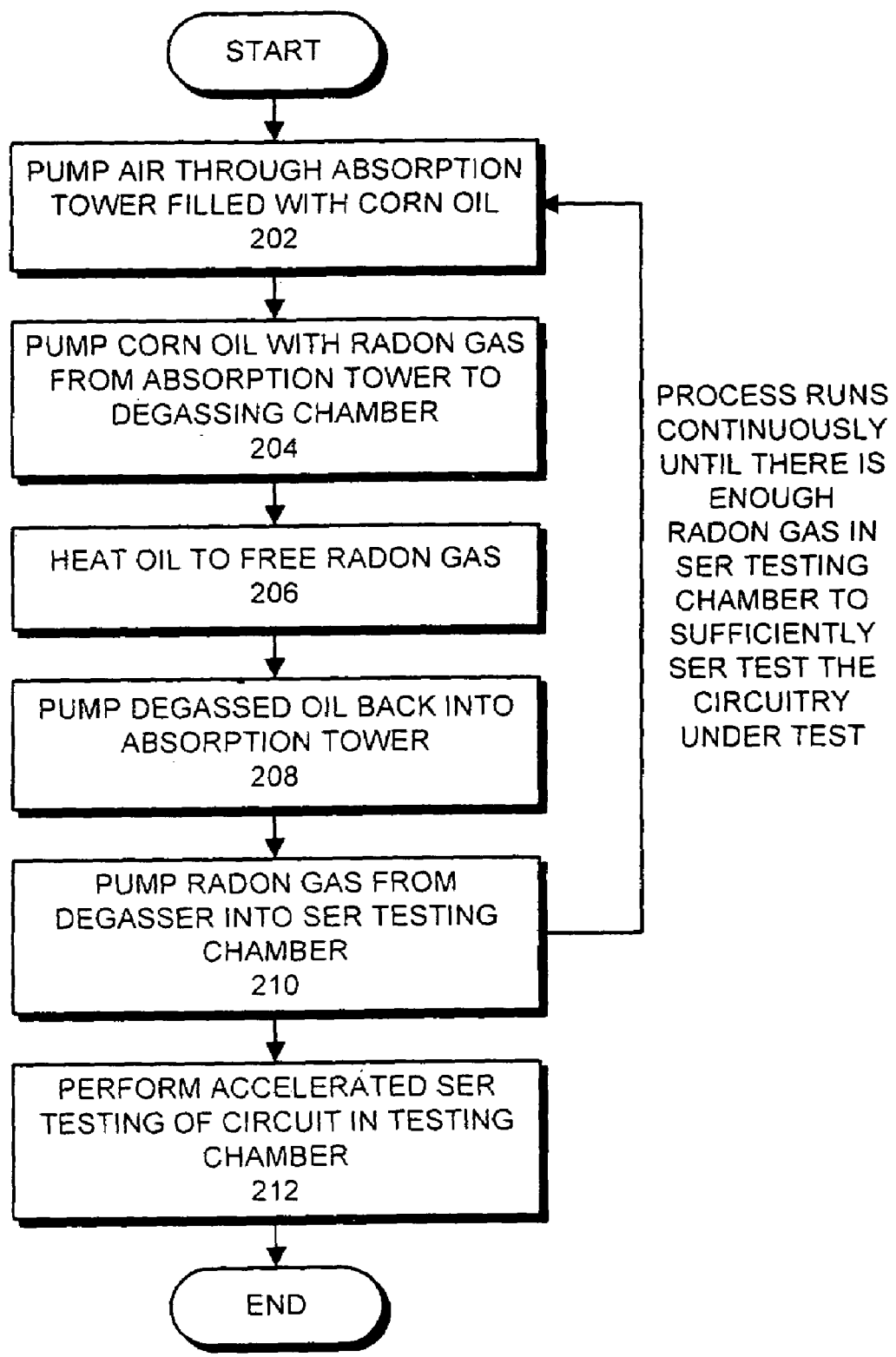
FIG. 2 presents a flowchart illustrating the process of accelerated SER testing circuitry in accordance with an embodiment of the present invention.

FIG. 2 presents a flowchart illustrating the process of accelerated SER testing of circuitry in accordance with an embodiment of the present invention. Air pump 103 pumps air through absorption tower 104 which is filled with corn oil (step 202), which traps the radon gas from the air. The invention exploits a revolutionary (but serendipitous) physical chemistry discovery made by K. Gross at Argonne Laboratory in 1994 that corn oil soaks up natural radon gas like a sponge at room temperature, but releases this gas when the oil is warmed slightly (45–60C). This gives rise to a simple apparatus that with about one liter of corn oil can continuously concentrate natural radon gas from the air we breathe (typically 0.5 pCi/liter in Southern California, up to 2.0 pCi/liter in some areas of the country, and up to 60 pCi/liter in some well-insulated basements) into a closed SER-Testing chamber. This collection method is described in more detail in U.S. Pat. No. 5,743,944, entitled, "Fluid Clathrate System for Continuous Removal of Heavy Noble Gasses from Mixtures of Lighter Gasses."

The physical-chemistry basis for the invention, established by Gross in numerous journal publications subsequent to his discovery, is that the corn oil acts as an (extremely rare) fluid clathrate. (A clathrate is a cage-like structure of molecules, which usually occurs only in solids). The billiard-ball shaped monatomic Rn noble gas atoms are just the right size to "fit snugly" into the interstitial spaces between the very large (100+ carbon) hydrocarbon molecules in the corn oil. When some heat is added, the oil molecules vibrate sufficiently that the noble gas atoms zip out.

Once the radon gas is trapped in the corn oil, oil pump 106 pumps the corn oil from absorption tower 104, into degassing chamber 108 (step 204). Inside degassing chamber 108, the oil is heated and the radon gas is freed from the oil (step 206). Oil pump 110 then pumps the degassed oil back into absorption tower 104 to repeat the absorption process (step 208). Simultaneously, vacuum pump 112 pumps the radon gas from degassing chamber 108 into SER testing chamber 102 (step 210). This process is continued into there is enough radon gas in SER testing chamber 102 to sufficiently perform accelerated SER testing on the circuitry under test. Next, the system performs accelerated SER testing on the circuit using any one of a number of known techniques (step 212). (For example, see U.S. Pat. No. 4,816,753 entitled "Method for Reliability Testing of Integrated Circuits" by inventor Leslie J. Palkuti, and U.S. Pat. No. 6,456,084 entitled "Radiation Test System" by inventors Kuang-Shyr Wu, Maw-Ching Lin, and Li-Shen Juhn).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for accelerated Soft-Error Rate (SER) testing of circuitry, comprising:
   collecting a radioactive gas from the atmosphere, wherein the radioactive gas is Radon, and wherein collecting the radioactive gas involves passing air from the atmosphere through oil so that the radioactive gas becomes trapped in the oil;
   concentrating the radioactive gas in a testing chamber; and
   SER testing the circuitry in the testing chamber, wherein the circuitry is bombarded by particles emitted from the radioactive gas;
   wherein using the radioactive gas from the atmosphere for SER testing provides increased safety margins for test personnel.

2. The method of claim 1, wherein the circuitry comprises an integrated circuit.

3. The method of claim 2, wherein the integrated circuit comprises a memory chip.

4. The method of claim 1, wherein the oil is corn oil.

5. The method of claim 1, wherein concentrating the radioactive gas further comprises:
   releasing the radioactive gas from the oil; and
   moving the radioactive gas into the testing chamber until a specified amount of the radioactive gas has been concentrated.

6. The method of claim 5, wherein releasing the radioactive gas from the oil further involves heating the oil, wherein heating the oil allows the radioactive gas to escape from the oil.

7. An apparatus for accelerated Soft-Error Rate (SER) testing of circuitry, comprising:
   a collection mechanism configured to collect a radioactive gas from the atmosphere, wherein the radioactive gas is Radon;
   a concentration mechanism configured to concentrate the radioactive gas in a testing chamber, wherein the concentration mechanism is further configured to pass air from the atmosphere through oil so that the radioactive gas becomes trapped in the oil; and
   a testing mechanism configured to SER test the circuitry in the testing chamber, wherein the circuitry is bombarded by particles emitted from the radioactive gas;
   wherein using the radioactive gas from the atmosphere for SER testing provides increased safety margins for test personnel.

8. The apparatus of claim 7, wherein the circuitry comprises an integrated circuit.

9. The apparatus of claim 8, wherein the integrated circuit comprises a memory chip.

10. The apparatus of claim 7, wherein the oil is corn oil.

11. The apparatus of claim 7, wherein the concentration mechanism further comprises:
    a degassing mechanism configured to release the radioactive gas from the oil; and
    a transport mechanism configured to move the radioactive gas into the testing chamber until a specified amount of the radioactive gas has been concentrated.

12. The apparatus of claim 11, wherein the degassing mechanism is further configured to heat the oil, wherein heating the oil allows the radioactive gas to escape from the oil.

13. A means for accelerated Soft-Error Rate (SER) testing of circuitry, comprising:
    a collection means for collecting a radioactive gas from the atmosphere, wherein the radioactive gas is Radon;
    a concentration means for concentrating the radioactive gas in a testing chamber, wherein the concentration mechanism is further configured to pass air from the atmosphere through oil so that the radioactive gas becomes trapped in the oil; and
    a testing means for SER testing the circuitry in the testing chamber, wherein the circuitry is bombarded by particles emitted from the radioactive gas;
    wherein using the radioactive gas from the atmosphere for SER testing provides increased safety margins for test personnel.

* * * * *